United States Patent
Huang et al.

(10) Patent No.: US 9,859,147 B2
(45) Date of Patent: Jan. 2, 2018

(54) FIN STRUCTURE CUTTING PROCESS

(71) Applicant: UNITED MICROELECTRONICS CORP., Hsin-Chu (TW)

(72) Inventors: Tong-Jyun Huang, Tainan (TW); Rai-Min Huang, Taipei (TW); I-Ming Tseng, Kaohsiung (TW); Kuan-Hsien Li, Tainan (TW); Chen-Ming Huang, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/336,811

(22) Filed: Oct. 28, 2016

(65) Prior Publication Data

US 2017/0047244 A1    Feb. 16, 2017

Related U.S. Application Data

(62) Division of application No. 14/696,494, filed on Apr. 27, 2015, now Pat. No. 9,524,909.

(30) Foreign Application Priority Data

Mar. 30, 2015   (TW) .............................. 104110308 A

(51) Int. Cl.
*H01L 29/06*   (2006.01)
*H01L 21/762*  (2006.01)
(Continued)

(52) U.S. Cl.
CPC .. *H01L 21/76224* (2013.01); *H01L 21/02271* (2013.01); *H01L 21/308* (2013.01); *H01L 21/3065* (2013.01); *H01L 21/3081* (2013.01); *H01L 21/823431* (2013.01); *H01L 21/823481* (2013.01); *H01L 27/0886* (2013.01); *H01L 29/0649* (2013.01); *H01L 29/0653* (2013.01)

(58) Field of Classification Search
CPC ........................ H01L 29/6681; H01L 27/0924
See application file for complete search history.

(56) References Cited

U.S. PATENT DOCUMENTS 8,617,996 B1 * 12/2013 Chi ................... H01L 21/30604
                                                           257/E21.377
2013/0309838 A1   11/2013 Wei
(Continued)

FOREIGN PATENT DOCUMENTS

JP           2007149942 A      6/2007

*Primary Examiner* — Thomas L Dickey
(74) *Attorney, Agent, or Firm* — Winston Hsu

(57) ABSTRACT

A fin structure cutting process includes the following steps. Four fin structures are formed in a substrate, where the four fin structures including a first fin structure, a second fin structure, a third fin structure and a fourth fin structure are arranged sequentially and parallel to each other. A first fin structure cutting process is performed to remove top parts of the second fin structure and the third fin structure, thereby a first bump being formed from the second fin structure, and a second bump being formed from the third fin structure. A second fin structure cutting process is performed to remove the second bump and the fourth fin structure completely, but to preserve the first bump beside the first fin structure. Moreover, the present invention provides a fin structure formed by said process.

13 Claims, 5 Drawing Sheets

(51) Int. Cl.
*H01L 21/8234* (2006.01)
*H01L 21/308* (2006.01)
*H01L 21/02* (2006.01)
*H01L 27/088* (2006.01)
*H01L 21/3065* (2006.01)

(56) References Cited

U.S. PATENT DOCUMENTS

2014/0353795 A1    12/2014   Tong
2015/0228722 A1    8/2015   Chung

* cited by examiner

FIN STRUCTURE CUTTING PROCESS

CROSS REFERENCE TO RELATED APPLICATIONS

This application is a divisional application of and claims the benefit of U.S. patent application Ser. No. 14/696,494, filed Apr. 27, 2015.

BACKGROUND OF THE INVENTION

1. Field of the Invention

The present invention relates generally to a fin structure and a fin structure cutting process, and more specifically to a fin structure and a fin structure cutting process applying a bump beside a fin structure.

2. Description of the Prior Art

With increasing miniaturization of semiconductor devices, various multi-gate MOSFET devices have been developed. The multi-gate MOSFET is advantageous for the following reasons. First, manufacturing processes of multi-gate MOSFET devices can be integrated into traditional logic device processes, and thus are more compatible. In addition, since the three-dimensional structure of the multi-gate MOSFET increases the overlapping area between the gate and the substrate, the channel region is controlled more effectively. This therefore reduces drain-induced barrier lowering (DIBL) effect and short channel effect. Moreover, the channel region is longer for the same gate length. Therefore, the current between the source and the drain is increased.

A multi-gate MOSFET has a gate formed on fin-shaped structures, and the fin-shaped structures are formed on a substrate, wherein the fin-shaped structures formed by etching the substrate are strip structures parallel to each other. With the demands of miniaturization of semiconductor devices, the width of each fin-shaped structure narrows and the spacings between the fin-shaped structures shrink. Thus, forming fin-shaped structures which can achieve the required demands under the restrictions of miniaturization, physical limitations and various processing parameters becomes an extreme challenge.

On the other hand, in the present semiconductor process, a localized oxidation isolation (LOCOS) or a shallow trench isolation (STI) are normally used to isolate each MOS. However, with the decrease in both design size and fabricating line width of the semiconductor wafer, the drawbacks of pits, crystal defects and longer bird's beak in the LOCOS process will greatly affect the characteristics of the semiconductor wafer. As well, the field oxide produced in the LOCOS process occupies a larger volume to affect the integration of the semiconductor wafer. Thus, in the submicron semiconductor process, the STI process is widely used as an isolation technique. The STI structure is generally disposed in a substrate between two adjacent MOS transistors and surrounds active areas of the substrate, to prevent carriers such as electrons or electrical holes from diffusing between the two adjacent MOS transistors through the substrate, which would lead to junction current leakage. Accordingly, the STI process can isolate components from each other and has advantages of smaller size, low cost and improved integration.

Multi-gate MOSFETs formed by integrating fin structures with isolation structures are widely used in the modern industry.

SUMMARY OF THE INVENTION

The present invention provides a fin structure and a fin structure cutting process, which forms a bump beside a fin structure, to prevent the fin structure from deforming or bending during later processes, especially an isolation structure process.

The present invention provides a fin structure cutting process including the following steps. Four fin structures are formed in a substrate, wherein the four fin structures include a first fin structure, a second fin structure, a third fin structure and a fourth fin structure arranged sequentially and parallel to each other. A first fin structure cutting process is performed to remove tops of the second fin structure and the third fin structure, thereby a first bump being formed from the second fin structure, and a second bump being formed from the third fin structure. A second fin structure cutting process is performed to remove the second bump and the fourth fin structure completely but to preserve the first bump beside the first fin structure.

The present invention provides a fin structure including a substrate, a first fin structure and a first bump being a single bump. The substrate has a fin structure area and an isolation area. The first fin structure is located in the substrate of the fin structure area. The first bump is disposed in the substrate of the isolation area beside the first fin structure.

According to the above, the present invention provides a fin structure and a fin structure cutting process, which forms a first bump beside a first fin structure, therefore preventing the first fin structure from deforming, bending, etc. in later processes such as an isolation structure forming process, which would degrade electrical performances such as reliabilities, yields of a formed semiconductor component such as a transistor.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
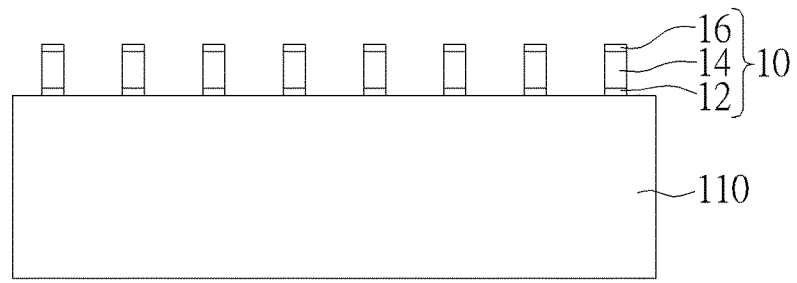
FIGS. 1-7 schematically depict diagrams of a fin structure cutting process according to an embodiment of the present invention.
Figure 2:
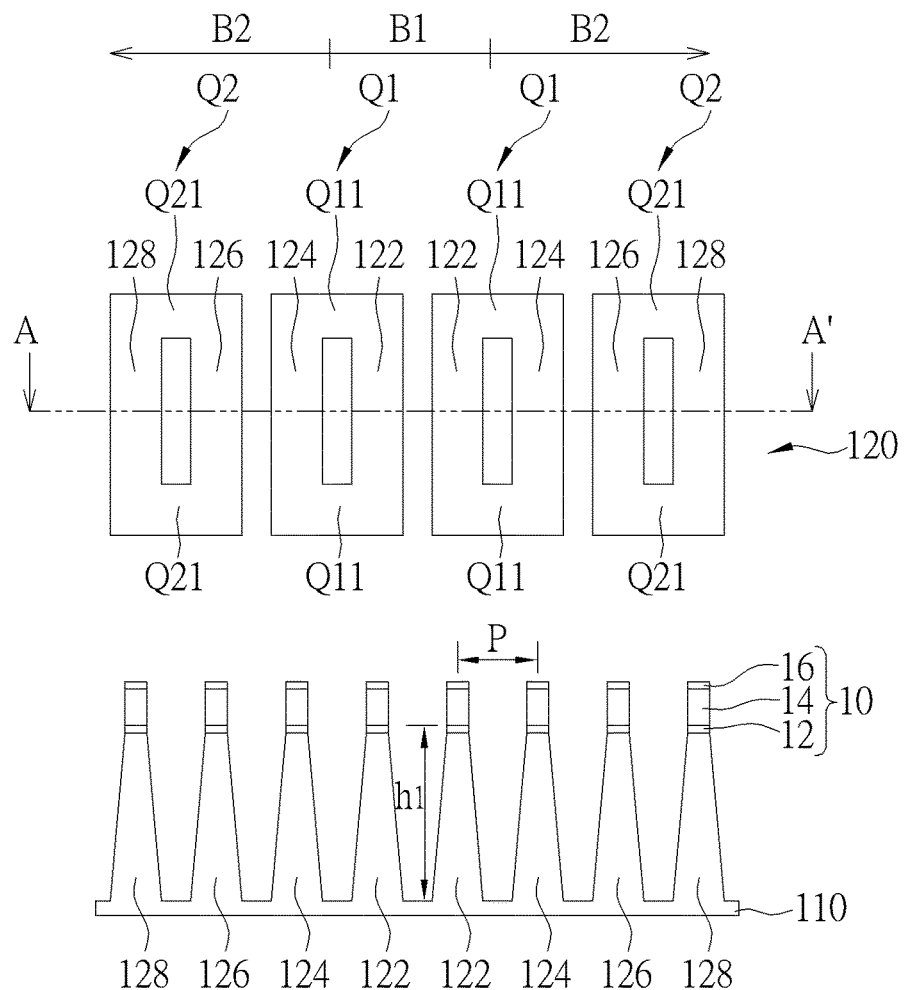
Figure 3:
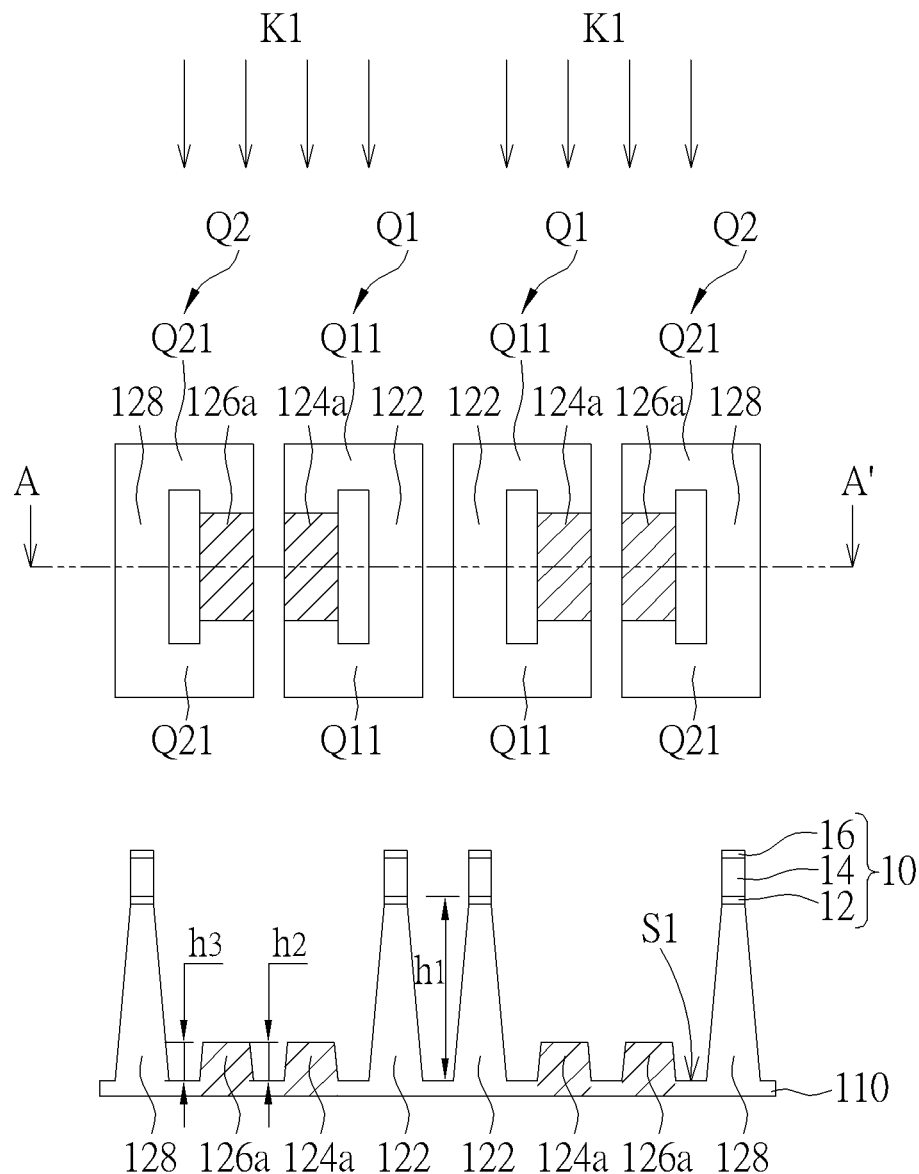
Figure 4:
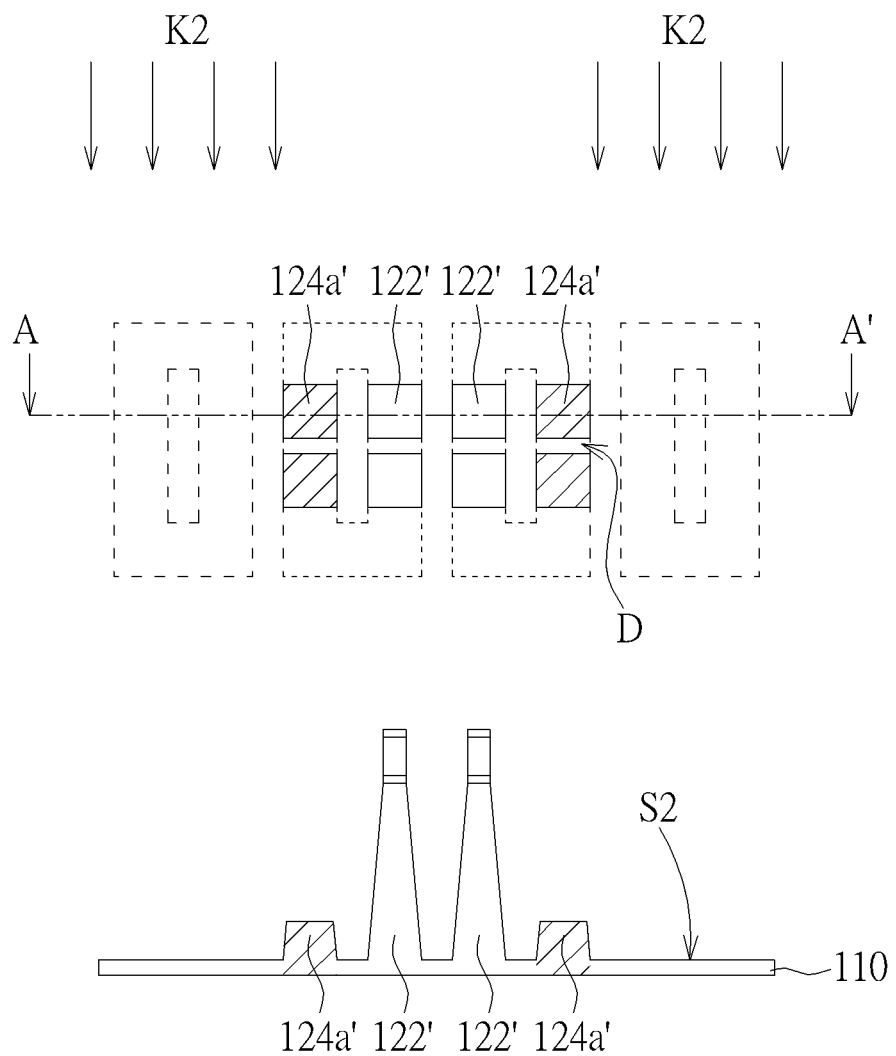

FIGS. 1-7 schematically depict diagrams of a fin structure cutting process according to an embodiment of the present invention. For clarifying the present invention, top diagrams of FIGS. 2-4 are top views while bottom diagrams of FIGS. 2-4 are cross-sectional views along AA' lines of the top diagrams. Please refer to FIGS. 1-2, eight fin structures 120 are formed in a substrate 110 by processes such as a photo etching process (PEP), a multi-patterning process, etc. Preferably, the process may be a spacer self-aligned double-patterning (SADP) process; that is, a sidewall image transfer (SIT) process. The fin structures 120 may include two first fin structures 122, two second fin structures 124, two third fin structures 126 and two fourth fin structures 128 arranged sequentially and parallel to each other. Eight fin structures 120 including two sets of one first fin structure 122, one second fin structure 124, one third fin structure 126 and one fourth fin structure 128 are depicted in this embodiment, but it is not limited thereto.

More precisely, each of the first fin structures 122 and the corresponding second fin structure 124 are corresponding longer parallel sides of a first rectangular frame fin structure layout Q1, and each of the third fin structures 126 and the corresponding fourth fin structure 128 are corresponding longer parallel sides of a second rectangular frame fin structure layout Q2. Therefore, two first rectangular frame fin structure layouts Q1 and two second rectangular frame fin structure layouts Q2 are depicted in this embodiment because of the two sets of one first fin structure 122, one second fin structure 124, one third fin structure 126 and one fourth fin structure 128. One first fin structure 122 and the corresponding second fin structure 124 in each of the first rectangular frame fin structure layouts Q1 are connected by two connecting parts Q11. Thereby, a closed rectangular frame layout pattern is constituted by the first fin structure 122, the corresponding second fin structure 124 and the connecting parts Q11. Likewise, one third fin structure 126 and the corresponding fourth fin structure 128 in each of the second rectangular frame fin structure layouts Q2 are connected by two connecting parts Q21. Thereby, a closed rectangular frame layout pattern is constituted by the third fin structure 126, the corresponding fourth fin structure 128 and the connecting parts Q21.

The method of forming the eight fin structures 120 in the substrate 110 includes, but is not limited to, the following. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate, a silicon-on-insulator (SOI) substrate or a substrate containing epitaxial layers such as a P-type substrate having a P-type epitaxial layer with a thickness of 2.5 micrometers. In this embodiment, the substrate 110 is a bulk substrate, wherein three-dimensional or non-planar transistors, and planar transistors may be respectively formed in different areas. In this embodiment, only a three-dimensional transistor area is depicted, but it is not limited thereto. A plurality of hard masks 10 are formed on the substrate 110. In this embodiment, the hard masks 10 are three-layer stacked structures, which may be oxide layer 12/nitride layer 14/oxide layer 16 structures, but it is not limited thereto. In another embodiment, the hard masks 10 may be single layers, dual layers or other multi-layers, depending upon demands of later processes.

As shown in FIG. 2, the substrate 110 is etched by the hard masks 10 to form the fin structures 120. The method of etching the substrate 110 may be preferably performing a dry etching process, which has an anisotropic etching properties, and thus can form the fin structures 120 having high (depth/width) aspect ratio and narrow pitches. In a practical case, the fin structures 120 have heights of 1200 angstroms and pitches p of 48 angstroms. In this embodiment, the substrate 110 may be at least divided into a fin structure area B1 and an isolation area B2. The isolation area B2 can surround the fin structure area B1 to electrically isolate the fin structures area B1 from other component areas. The first fin structures 122 are located in the fin structure area B1 while the second fin structures 124, the third fin structures 126 and the fourth fin structures 128 are located in the isolation area B2, but it is not limited thereto.

A first fin structure cutting process K1 is performed to remove tops of the second fin structures 124 and the third fin structures 126 to form two first bumps 124a and two second bumps 126a, as shown in FIG. 3. That is, the first bumps 124a are formed from the second fin structures 124 while the second bumps 126a are formed from the third fin structures 126. The first fin structure cutting process K1 may be a photolithography and etching process, which may cover photoresists (not shown) in the non-removed regions, and then etches the tops of the second fin structures 124 and the third fin structures 126, but it is not limited thereto.

It is emphasized that, for preventing the first fin structures 122 from deforming and bending in later processes such as an isolation structure forming process by the first bumps 124a, preserved heights h2 of the first bumps 124a cannot be too low; for preventing the first bumps 124a from penetrating through an isolation structure, affecting a formed transistor on the isolation structure, the heights h2 of the first bumps 124a are preferably 0.2 times the heights h1 of the first fin structures 122. The heights h2 of the first bumps 124a are at a range of 100-250 angstroms, but it is not limited thereto. In a preferred embodiment, as the heights h1 of the first fin structures 122 are 1200 angstroms, the heights h2 of the first bumps 124a are 250 angstroms. Since the first bumps 124a and the second bumps 126a are formed by the same first fin structure cutting process K1 having uniform cutting capabilities, the heights h2 of the first bumps 124a are equal to heights h3 of the second bumps 126a, but it is not limited thereto. In another embodiment, due to the second bumps 126a will being removed in later processes, heights of the second bumps 126a are not limited, which are preferably close to heights of the fin structures 120, meaning the heights h1 of the first fin structures 122. Thereby, the substrate 110 can have a flat surface S1 in later processes.

A second fin structure cutting process K2 is performed to remove the second bumps 126a and the fourth fin structures 128 completely but to preserve first bumps 124a' beside first fin structures 122', as shown in FIG. 4. The second fin structure cutting process K2 may be a photolithography and etching process, which may cover photoresists (not shown) in the non-removed regions, and then etches and removes exposed regions, but it is not limited thereto.

In this embodiment, the second fin structure cutting process K2 is performed to completely remove protruding parts of the whole first rectangular frame fin structure layouts Q1 and the whole second rectangular frame fin structure layouts Q2 except for the first bumps 124a' and the first fin structures 122'; that is, to remove the second bumps 126a, the fourth fin structures 128 and the connecting parts Q11/Q21, and preferably to flatten a surface S2 of the substrate 110. Moreover, the first bumps 124a and the first fin structures 122 are also cut off by the second fin structure cutting process K2, but it is not limited thereto. In other cases, cutting the first fin structures 122, cutting the first bumps 124a and entirely removing the protruding parts of the whole first rectangular frame fin structure layouts Q1 and the whole second rectangular frame fin structure layouts Q2 except for the first bumps 124a' and the first fin structures 122' may be performed by different processes. In this embodiment, parts D of the first bumps 124a' and the first fin structures 122' are preferably the same level with the surface S2 of the substrate 110 to form a flat surface, but it is not limited thereto. In other embodiments, the parts D of the first bumps 124a' and the first fin structures 122' may be horizontally higher than the surface S2 of the substrate 110. Dashed lines in FIG. 4 are parts removed by the second fin structure cutting process K2. Thereby, only the first bumps 124a' beside the first fin structures 122' remain after the second fin structure cutting process K2 is performed. In the present invention, only one single first bump 124a' is preferably formed beside each of the first fin structures 122', but a plurality of first bumps 124a' can still be formed beside each of the first fin structures 122', depending upon practical requirements.

Figure 5:
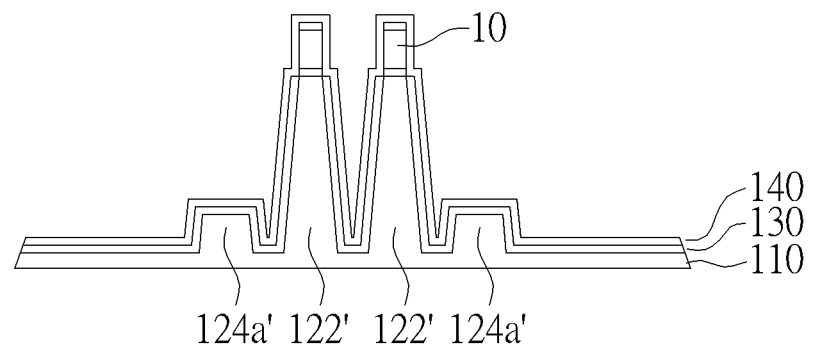

As shown in FIG. 5, a liner 130 and a buffer layer 140 may optionally and conformally cover the first fin structures 122' and the first bumps 124a'. In the present invention, the liner 130 and the buffer layer 140 maybe oxide layers, nitride layers, oxynitride layers or others, depending upon practical requirements. In one case, the liner 130 may be an oxide layer, which may be formed by a thermal oxide process such as an in-situ steam generation (ISSG) process, thereby the liner 130 only covering the first fin structures 122', the first bumps 124a' and the substrate 110 composed of silicon without covering the hard masks 10; the buffer layer 140 may be a nitride layer, which may be formed by an atomic layer deposition (ALD) process, thereby the buffer layer 140 entirely covering the first fin structures 122', the first bumps 124a', the substrate 110 and the hard masks 10, but it is not limited thereto.

Figure 6:
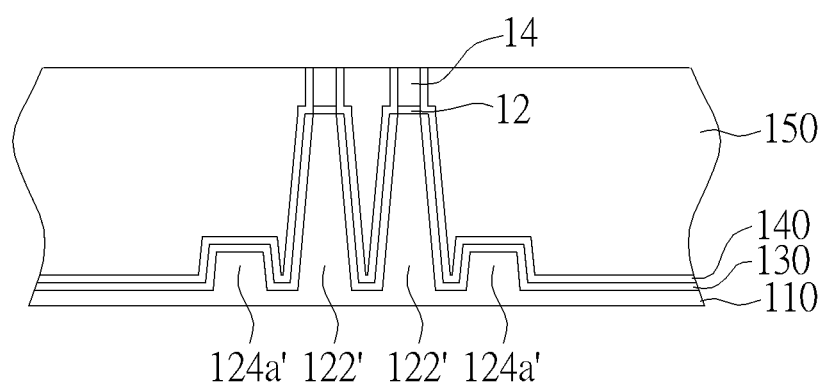

As shown in FIG. 6, an isolation structure 150 may be formed on the substrate 110 beside each of the first fin structures 122'and each of the first bumps 124a'. More precisely, an isolation material (not shown) may blanketly cover the first fin structures 122', the first bumps 124a', the substrate 110 and the hard masks 10; and then the isolation material is planarized until the hard masks 10 are exposed to form the isolation structure 150. The isolation structure 150 may be composed of oxides or other isolation materials. In this embodiment, due to the top layers of the hard masks 10 being the oxide layers 16 and the isolation structure 150 being composed of oxides as well, the oxide layers 16 will be removed while the isolation material is planarized.

Figure 7:
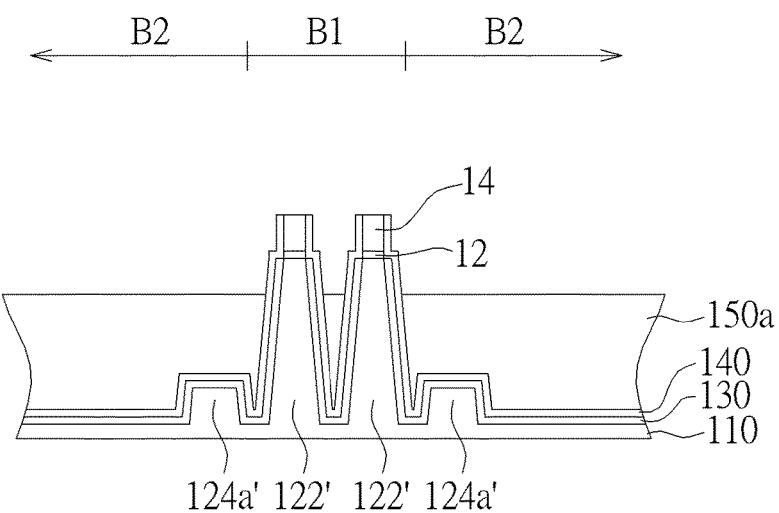

Thereafter, the isolation structure 150 is etched back to form an isolation structure 150a, thus the first fin structures 122' protruding from the isolation structure 150a, as shown in FIG. 7. In this embodiment, the isolation structure 150a maybe a shallow trench isolation (STI) structure, which may be composed of oxide, formed by a flowable chemical vapor deposition (FCVD) process, but it is not limited thereto.

It is noted that, the first fin structures 122' must suffer high temperature processes such as a high temperature curing process for forming the isolation structure 150 by the flowable chemical vapor deposition (FCVD) after the fin structures 120 are formed. In the present invention, the first bumps 124a' formed beside the first fin structures 122' can prevent the first fin structures 122' from bending by the high temperatures, therefore avoiding a formed semiconductor component such as a transistor from degradation of electrical performances such as reliabilities or yields. Furthermore, the first fin structures 122' of the present invention protrude from the isolation structure 150a, but the isolation structure 150a covers the first bumps 124a'. This means the first bumps 124a' do not penetrate through the isolation structure 150a, and thus do not affect structures on the isolation structure 150a.

In this embodiment, the hard masks 10 can be removed right after the isolation structure 150a is formed. Thereafter, processes such as a gate forming process, a source/drain forming process, a replacement metal gate (RMG) process, a salicide process, etc. disposing transistors on the first fin structures 122' can be carried out, but it is not limited thereto. In other embodiments, the hard masks 10 may be removed before the isolation structure 150 is formed, such that the hard masks 10 may be removed after the second fin structure cutting process K2 is performed, but before the isolation structure 150 is formed, depending upon practical requirements.

To summarize, the present invention provides a fin structure and a fin structure cutting process, which forms first bumps beside first fin structures, therefore preventing the first fin structures from deforming, bending, etc. in later processes such as an isolation structure forming process, which would degrade electrical performances such as reliabilities, yields of a formed semiconductor component such as a transistor. Preferably, the first fin structures protrude an isolation structure without the first bumps penetrating through the isolation structure, therefore structures formed on the isolation structure will not be affected.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fin structure cutting process, comprising:
   forming four fin structures in a substrate, wherein the four fin structures comprise a first fin structure, a second fin structure, a third fin structure and a fourth fin structure arranged sequentially and parallel to each other;
   performing a first fin structure cutting process to remove tops of the second fin structure and the third fin structure, thereby a first bump being formed from the second fin structure, and a second bump being formed from the third fin structure; and
   performing a second fin structure cutting process to remove the second bump and the fourth fin structure completely but to preserve the first bump beside the first fin structure.

2. The fin structure cutting process according to claim 1, wherein the steps of forming the four fin structures in the substrate comprise:
   forming a plurality of hard masks on the substrate; and
   etching the substrate by the hard masks, to form the four fin structures.

3. The fin structure cutting process according to claim 2, further comprising:
   removing the hard masks after the second fin structure cutting process is performed.

4. The fin structure cutting process according to claim 1, further comprising:
   forming an isolation structure on the substrate beside the first fin structure and the first bump after the second fin structure cutting process is performed.

5. The fin structure cutting process according to claim 4, wherein the isolation structure is formed by a flowable chemical vapor deposition (FCVD) process.

6. The fin structure cutting process according to claim 4, further comprising:
   sequentially forming a liner and a buffer layer conformally covering the first fin structure and the first bump before the isolation structure is formed.

7. The fin structure cutting process according to claim 1, wherein the substrate has a fin structure area and an isolation area, wherein the first fin structure is located in the fin structure area, and the second fin structure, the third fin structure and the fourth fin structure are located in the isolation area.

8. The fin structure cutting process according to claim 1, wherein the first bump has a height less than 0.2 times a height of the first fin structure.

9. The fin structure cutting process according to claim 8, wherein the first bump has a height of 250 angstroms while the first fin structure has a height of 1200 angstroms.

10. The fin structure cutting process according to claim 1, wherein the first bump has a height at a range of 100-250 angstroms.

11. The fin structure cutting process according to claim 1, wherein the first fin structure and the second fin structure are corresponding two sides of a first rectangular frame fin structure layout, and the third fin structure and the fourth fin structure are corresponding two sides of a second rectangular frame fin structure layout.

12. The fin structure cutting process according to claim 11, wherein the first fin structure cutting process is performed to only remove the tops of the second fin structure and the third fin structure, and the second fin structure cutting process is performed to remove the whole first rectangular frame fin structure layout and the whole second rectangular frame fin structure layout except for the first bump and the first fin structure.

13. The fin structure cutting process according to claim 1, further comprising:
    cutting the first fin structure while the second fin structure cutting process is performed.

\* \* \* \* \*